US011955937B2

(12) United States Patent
Hayashi et al.

(10) Patent No.: US 11,955,937 B2
(45) Date of Patent: Apr. 9, 2024

(54) AMPLIFICATION DEVICE AND TRANSMISSION/RECEPTION SYSTEM (71) Applicant: Koden Electronics Co., Ltd., Tokyo (JP)

(72) Inventors: Daisuke Hayashi, Tokyo (JP); Norihito Hamada, Tokyo (JP); Shigeo Kawasaki, Tokyo (JP)

(73) Assignee: KODEN ELECTRONICS CO., LTD., Tokyo (JP)

( * ) Notice: Subject to any disclaimer, the term of this patent is extended or adjusted under 35 U.S.C. 154(b) by 593 days.

(21) Appl. No.: 17/155,464

(22) Filed: Jan. 22, 2021

(65) Prior Publication Data
US 2021/0242841 A1 Aug. 5, 2021

(30) Foreign Application Priority Data

Jan. 30, 2020 (JP) ................. 2020-013786

(51) Int. Cl.
*H03F 1/30* (2006.01)
*H03F 1/02* (2006.01)
*H03F 3/24* (2006.01)
*H04B 1/02* (2006.01)
*H04B 1/06* (2006.01)

(52) U.S. Cl.
CPC ............... *H03F 3/245* (2013.01); *H03F 1/02* (2013.01); *H04B 1/02* (2013.01); *H04B 1/06* (2013.01)

(58) Field of Classification Search
CPC .................................. H03F 1/30; H03G 3/20
USPC ........................ 330/289, 129, 136
See application file for complete search history.

(56) References Cited

U.S. PATENT DOCUMENTS

2003/0040290 A1  2/2003  Sahiman et al.
2007/0281638 A1  12/2007  Hansen

FOREIGN PATENT DOCUMENTS

| JP | 63-184413 | 7/1988 |
| JP | 02-116769 | 5/1990 |
| JP | 5-23614 | 3/1993 |
| JP | 5-153175 | 6/1993 |
| JP | 2005-109768 | 4/2005 |
| JP | 2012-202923 | 10/2012 |

(Continued)

OTHER PUBLICATIONS

H. Chen et al., "Design of an X-band pulsed SSPA based on a cascade technique", Proc. IEEE Int. Conf. Microw. Technol. Comput. Electromagn, May 2011, pp. 152-155.

(Continued)

*Primary Examiner* — Henry Choe
(74) *Attorney, Agent, or Firm* — GREENBLUM & BERNSTEIN, P.L.C.

(57) ABSTRACT

An amplification device includes a pulse signal acquisition part, a dummy signal generation part, a combination part, an amplifier and a separation part. The pulse signal acquisition part acquires a desired signal that is a pulse signal to be amplified. The dummy signal generation part generates a dummy signal. The combination part adds the dummy signal before and after the desired signal and outputs a composite signal. The amplifier amplifies the composite signal and outputs an amplified composite signal. The separation part extracts an amplified desired signal that is a signal resulting from amplification of the desired signal, from the amplified composite signal and outputs the amplified desired signal. Power of the composite signal is power that makes the amplification part operate nonlinearly.

17 Claims, 12 Drawing Sheets

(56) References Cited

FOREIGN PATENT DOCUMENTS

| JP | 2014-25727 | 2/2014 |
| JP | 2019-28048 | 2/2019 |
| WO | 2000/27038 | 5/2000 |

OTHER PUBLICATIONS

Hayashi et al., "Time-domain distortion of a pulse-operated high-power GaN amplifier and a reduction method", IEICE Communications Express, vol. 8, No. 4, , Jan. 30, 2019, pp. 87-92.
J. E. Cilliers et al., "Pulse Compression Sidelobe Reduction by Minimization of Lp-Norms", IEEE Trans. AERO, vol. 43, No. 3, Jul. 2007, pp. 1238-1247.
C. Wang et al., "An electrothermal model for empirical large-signal modeling of AlGaN/GaN HEMTs including self- heating and ambient temperature effects", IEEE Trans. Microwave Theory Tech., vol. 62, No. 12, Dec. 2014, pp. 2878-2887.
C. K. Chu et al., "An X-band high-power and high-PAE PHEMT MMIC power amplifier for pulse and CW operation", IEEE Microw. and Wireless Compon. Lett., vol. 18, No. 10, Oct. 2008, pp. 707-709.
S. C. Cripps, "RF Power Amplifiers for Wireless Communications", Second Edition, Artech House, 2006, pp. 1-456.
May 23, 2023 Japanese Office Action in corresponding Japanese Application No. 2020-013786 and translation thereof.
Sep. 19, 2023 Japanese Office Action in corresponding Japanese Application No. 2020-013786 and translation thereof.

AMPLIFICATION DEVICE AND TRANSMISSION/RECEPTION SYSTEM

BACKGROUND OF THE INVENTION

The present invention relates to a high-power amplification device that amplifies a pulse signal and a transmission/reception system using the amplification device.

As high-power amplification devices that amplify a pulse signal, for example, amplification devices that generate a transmission signal of radar have been known as conventional art. For example, in many radar systems using semiconductor amplifiers, a chirp signal whose frequency has been linearly changed within a pulse signal section is used as a transmission signal and the chirp signal is subjected to pulse compression processing on the reception side to achieve detection performance that is comparable with that of an electron tube. For the semiconductor amplifier, GaN (gallium nitride), which has, e.g., excellent thermal conductivity, bandgap and breakdown voltage and can handle higher power in comparison with GaAs in the same size, is often used. Examples of literatures relating to an amplification device using GaN such as the above include, e.g., Non-Patent Literature 1 (S. C. Cripps, "RF Power Amplifiers for Wireless Communications", Artech House, Boston, London, 2006), Non-Patent Literature 2 (H. Chen, L. J. Jiang, X. F. Ji, Y. X. Zhang, "Design of an X-band pulsed SSPA based on a cascade technique", Proc. IEEE Int. Conf. Microw. Technol. Comput. Electromagn, pp. 152-155, May 2011), Non-Patent Literature 3 (C. K. Chu, H. K. Huang, H. Z. Liu, C. H. Lin, C. H. Chang, C. L. Wu, C. S. Chang, Y. H. Wang, "An X-band high-power and high-PAE PHEMT MMIC power amplifier for pulse and CW operation", IEEE Microw. Wireless Compon. Lett., vol. 18, no. 10, pp. 707-709, October 2008), and Non-Patent Literature 4 (C. Wang, Y. Xu, X. Yu, C. Ren, Z. Wang, H. Lu, T. Chen, B. Zhang, and R. Xu, "An electrothermal model for empirical large-signal modeling of AlGaN/GaN HEMTs including self-heating and ambient temperature effects," IEEE Trans. Microwave Theory Tech., vol. 62, no. 12, pp. 2878-2887, December 2014).

Also, as a pulse transmission apparatus, the art of Patent Literature 1 (Japanese Patent Application Laid Open No. H2-116769) has been known and the art discloses that a dummy pulse is inserted into an interval between pulses or immediately before a leading pulse or the both in a pulse sequence in order to reduce distortion in amplitude and phase of the pulses.

SUMMARY OF THE INVENTION

However, in a semiconductor amplification element using GaN, e.g., the gain and efficiency change according to the output power (see Non-Patent Literature 1). A high power operation characteristic to a GaN amplifier is an operation in a nonlinear region, and at the time of maximum power output of the GaN amplifier, it is not uncommon that a gain decrease of no less than 3 dB occurs in comparison with a linear region (see Non-Patent Literatures 2 and 3). Also, a change in power efficiency causes a change in amount of heat generated around the device. This temperature change is determined by the structure of the semiconductor device and does not coincide with the envelope of the RF signal. Therefore, in the GaN amplifier, hysteresis occurs, and the hysteresis is called "memory effect" and affects linearity of the output signal (see Non-Patent Literature 4). These characteristics can be considered as being also affected by, e.g., individual differences between a plurality of elements in operation of the elements, signal settings and the ambient temperature.

Also, an amplification device that handles high output power generates a large amount of heat, and thus, if a dummy signal is inserted into an entire interval between pulses, the problem of heat generation becomes quite significant, and therefore, the art of Patent Literature 1 cannot be used.

An object of the present invention is to reduce waveform distortion in an amplification device that amplifies a pulse signal in a nonlinear region.

A first amplification device of the present invention includes a pulse signal acquisition part, a dummy signal generation part, a combination part, an amplifier and a separation part. The pulse signal acquisition part acquires a desired signal that is a pulse signal to be amplified. The dummy signal generation part generates a dummy signal. The combination part adds the dummy signal before and after the desired signal and outputs a composite signal. The amplifier amplifies the composite signal and outputs an amplified composite signal. The separation part extracts an amplified desired signal that is a signal resulting from amplification of the desired signal, from the amplified composite signal and outputs the amplified desired signal. Power of the composite signal is power that makes the amplification part operate nonlinearly. The power of the composite signal is constant within a time range obtained by addition of a predetermined time to a time during which the desired signal exists.

A second amplification device of the present invention includes a pulse signal acquisition part, a dummy signal generation part, a combination part and an amplifier. The pulse signal acquisition part acquires a desired signal that is a pulse signal to be amplified. The dummy signal generation part generates a dummy signal. The combination part adds the dummy signal before and after the desired signal and outputs a composite signal. The amplifier amplifies the composite signal and outputs an amplified composite signal. The dummy signal is a signal that is separable from the desired signal. The power of the composite signal is power that makes the amplification part operate nonlinearly. The power of the composite signal is constant within a time range obtained by addition of a predetermined time to a time during which the desired signal exists.

Effect of the Invention

According to the amplification device according to the present invention, a dummy signal is disposed in each of parts in which a shape of a pulse signal is affected by nonlinearity and transient response and the dummy signal is removed after amplification, enabling amplification of the pulse signal with distortion reduced.

DESCRIPTION OF EMBODIMENTS

An embodiment of the present invention will be described in detail below. Note that component parts having a same function are provided with a same reference numeral and overlapping description thereof will be omitted.

First Embodiment

Analysis

Figure 1:
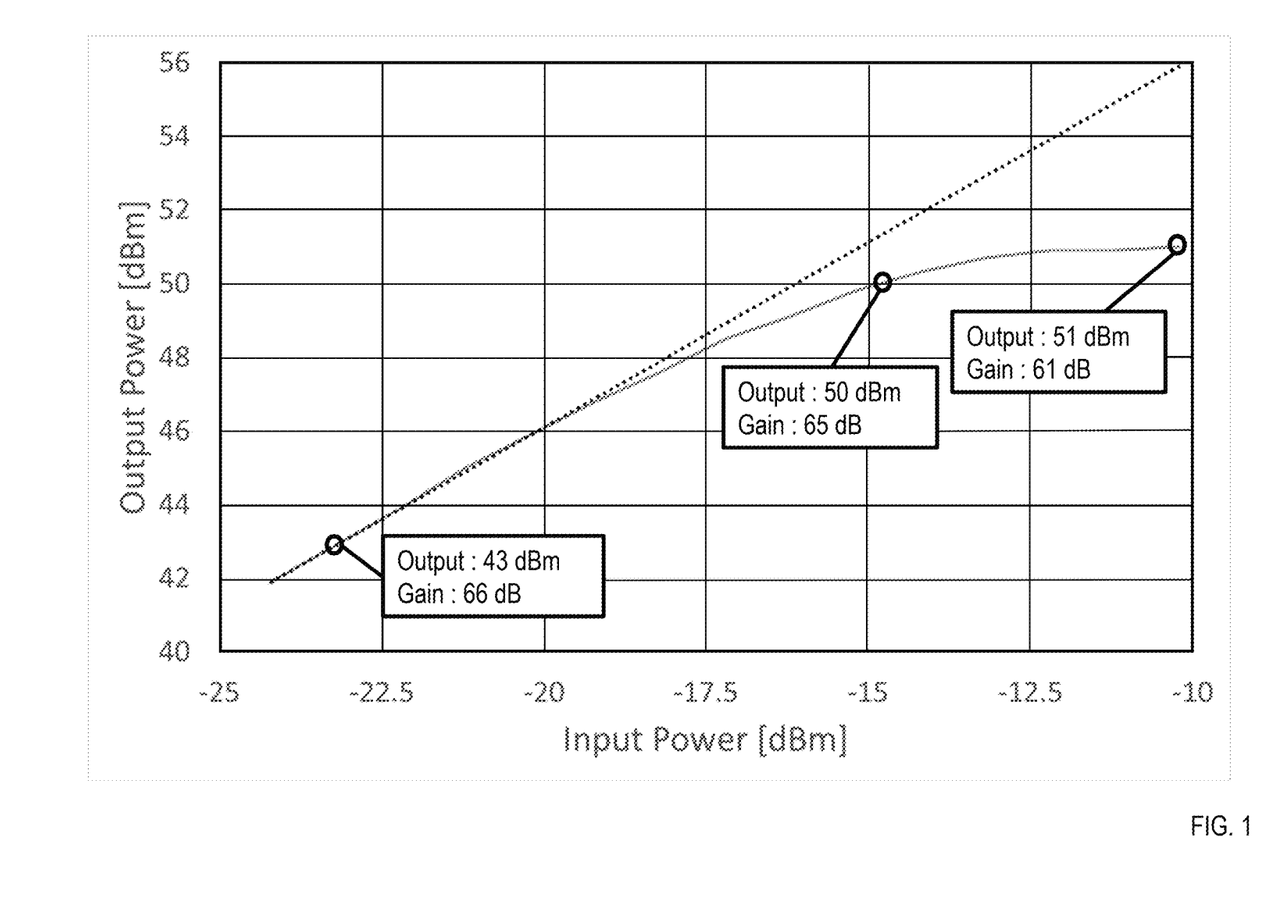
FIG. 1 is a diagram illustrating a result of a test for input and output characteristics when a pulse signal is input to an amplifier.

FIG. 1 illustrates a result of a test for input and output characteristics when a pulse signal is input to an amplifier. The abscissa axis represents power of an input signal and the ordinate axis represents power of an output signal. In the test, an amplifier including a three-stage connection in which a preamplifier that is a GaAs amplification element and a driver amplifier and a power amplifier, each of which is a GaN amplification element, are connected in series was used. The pulse signal had a center frequency of 9.41 GHz, a pulse width of 4μ seconds, a sweep frequency width of 15 MHz, a repetition frequency of 2600 Hz and a rise time and a fall time of 0.4μ seconds. When input power was −23 dBm, output power was 43 dBm and a gain was 66 dB. It can be seen that in this range, the amplifier operated linearly. When the input power was −15 dBm, the output power was 50 dBm and the gain was 65 dB. When the input power was −10 dBm, the output power was 51 dBm and the gain was 61 dB. It can be seen that in this range, the amplifier operated nonlinearly. When the input power was −10 dBm, the gain was decreased by 5 dB in comparison with operation in the linear region.

Figure 2:
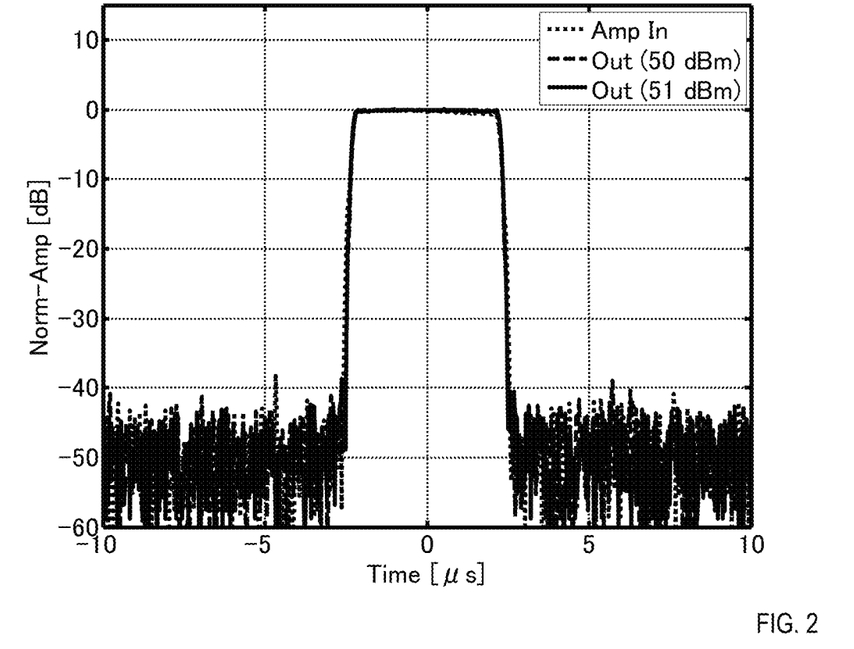
FIG. 2 is a diagram illustrating results of actual measurement of outputs when a pulse signal is input to the amplifier having the characteristics in FIG. 1.
Figure 3A:
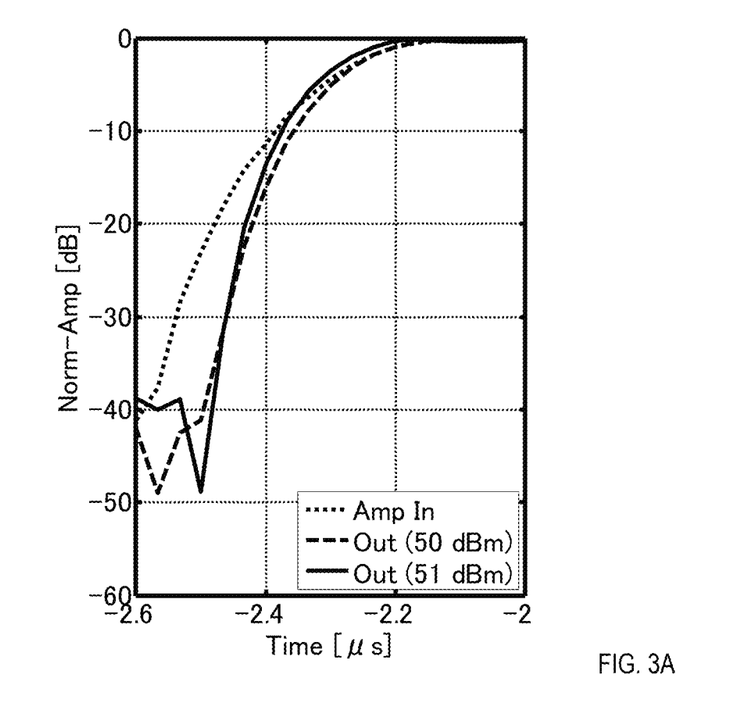
FIG. 3A is a diagram of the rise part in FIG. 2 with the abscissa axis enlarged.
Figure 3B:
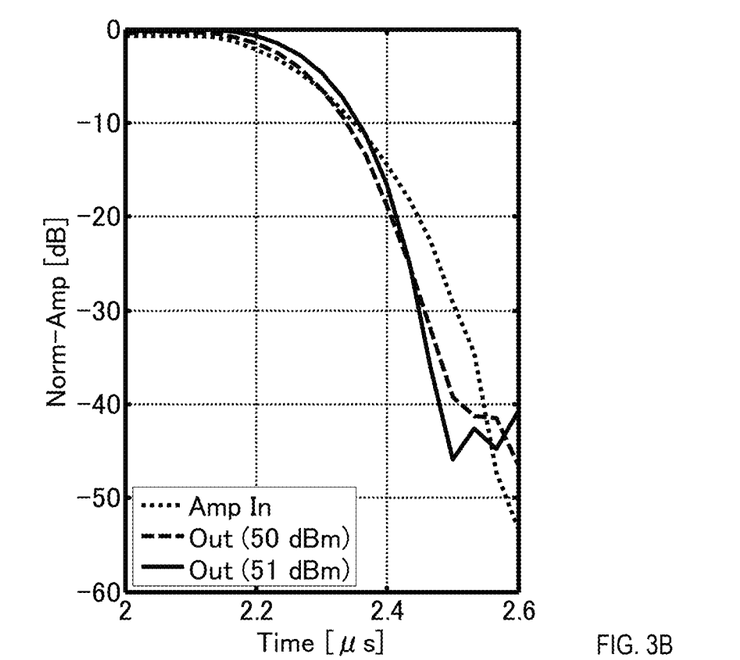
FIG. 3B is a diagram of the fall part in FIG. 2 with the abscissa axis enlarged.

FIG. 2 illustrates results of actual measurement of outputs when a pulse signal was input to the amplifier having the characteristics in FIG. 1. The abscissa axis represents time and the ordinate axis represents normalized amplitude (amplitude where a maximum value of the signal is 0 dB). The dotted line (indicated as "Amp In" in the figure) indicates an envelope of the input signal. The dashed line (indicated as "Out (50 dBm)" in the figure) indicates an envelope of an output signal when power of the output signal was 50 dBm. The solid line (indicated as "Out (51 dBm)" in the figure) indicates an envelope of the output signal when the power of the output signal was 51 dBm. In the below description, the term "envelope" may be omitted; however, a shape of a signal means a shape of an envelope and distortion of a signal means distortion of an envelope. FIG. 3A is a diagram of the rise part in FIG. 2 with the abscissa axis enlarged. FIG. 3B is a diagram of the fall part in FIG. 2 with the abscissa axis enlarged. It can be seen that in each of the rise and the fall, the amplitude varied abruptly. Also, a pulse width at an amplitude that is 6 dB smaller than a maximum value of the amplitude is largest when the power of the output signal was 51 dBm. In other words, it can be understood that when the amplifier operates in the nonlinear region, the amplifier performs behavior in such a manner that the pulse width becomes larger.

Figure 4A:
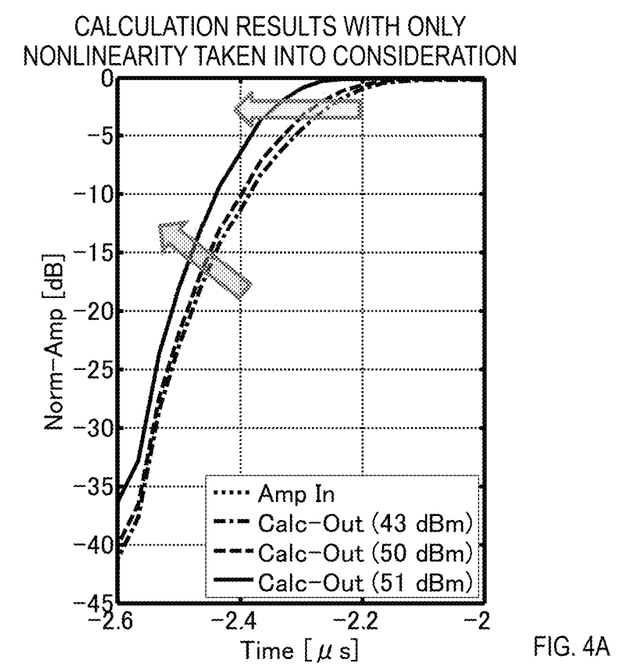
FIG. 4A is a diagram illustrating simulations with only nonlinearity taken into consideration.
Figure 4B:
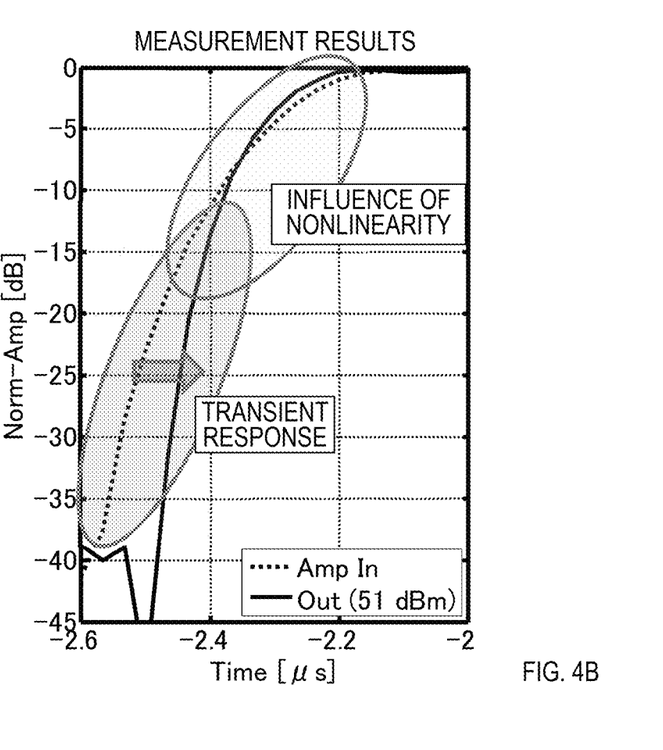
FIG. 4B is a diagram illustrating a measurement result of a test.

FIGS. 4A and 4B indicate a difference between simulations with only nonlinearity taken into consideration and a measurement result of a test. FIG. 4A is a diagram illustrating simulations with only nonlinearity taken into consideration. FIG. 4B is a diagram illustrating a measurement result of a test. The abscissa axis represents time and the ordinate axis represents normalized amplitude. The dotted line (indicated as "Amp In" in each of the figures) indicates an envelope of an input signal. The alternate long and short dash line (indicated as "Out (43 dBm)" in the figure) indicates an envelope of an output signal when power of the output signal is 43 dBm. The dashed line (indicated as "Out (50 dBm)" in the figure) indicates an envelope of the output signal when power of the output signal is 50 dBm. FIG. 4A illustrates results of simulations with only the characteristics relating to nonlinearity in FIG. 1 taken into consideration. FIG. 4B indicates an analysis relating to the characteristics of the rise indicated in FIG. 3A. Note that in FIG. 4A, the envelope of the input signal (dotted line) cannot be recognized because of overlapping with the envelope of the output signal when power of the output signal is 43 dBm (alternate long and short dash line). In FIG. 4B, for explanation of an influence of nonlinearity and transient response, only the envelope of the input signal (dotted line) and the envelope of the output signal when the power of the output signal was 51 dBm (solid line) are illustrated. Where only the influence of nonlinearity is taken into consideration, when the output power becomes large, a tendency of an abrupt rise of the amplitude and an increase in pulse width occurs. However, no delay relative to the input signal occurs. On the other hand, if only a delay is taken into consideration, the phenomenon of the increase in pulse width cannot be explained. The measurement result illustrated in FIG. 4B can be considered as one affected by both nonlinearity and transient response.

Figure 5:
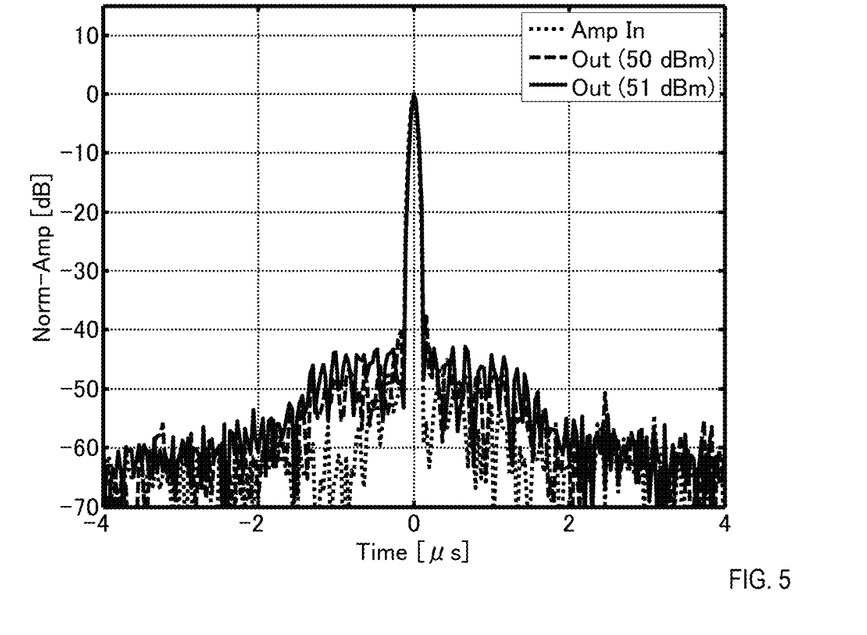
FIG. 5 is a diagram illustrating results of a test in which the signal in FIG. 2 had been subjected to pulse compression.

FIG. 5 illustrates results of a test in which the signal in FIG. 2 had been subjected to pulse compression. In the pulse compression, a mismatched filter based on Reference Literature 1 (J. E. Cilliers, J. C. Smit, "Pulse Compression Sidelobe Reduction by Minimization of Lp-Norms", IEEE Trans. AERO, Vol. 43, No. 3, pp. 1238-1247, July 2007) was used. Pulse compression is processing performed by a receiver in the case of a radar system. Distortion of a pulse waveform occurred in an amplifier decreases an SNR (signal to noise ratio) of an output of pulse compression. In the example in FIG. 5, an SNR was around 45 dB. Also, it has been found that in the nonlinear region, as the power of the input signal is larger, the SNR decreases.

Present Invention

Figure 6:
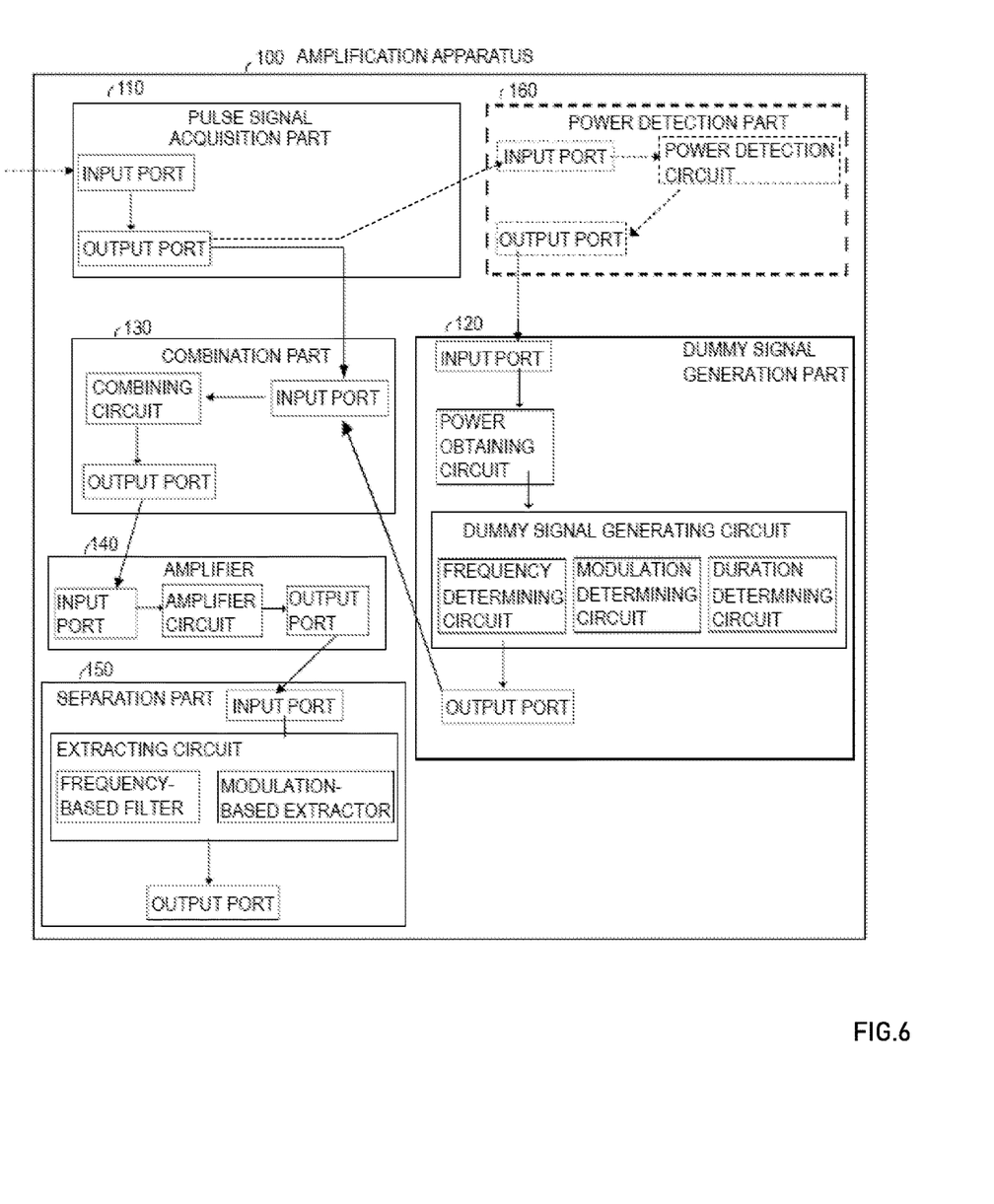
FIG. 6 is a diagram illustrating an example functional configuration of an amplification device of a first embodiment.
Figure 7:
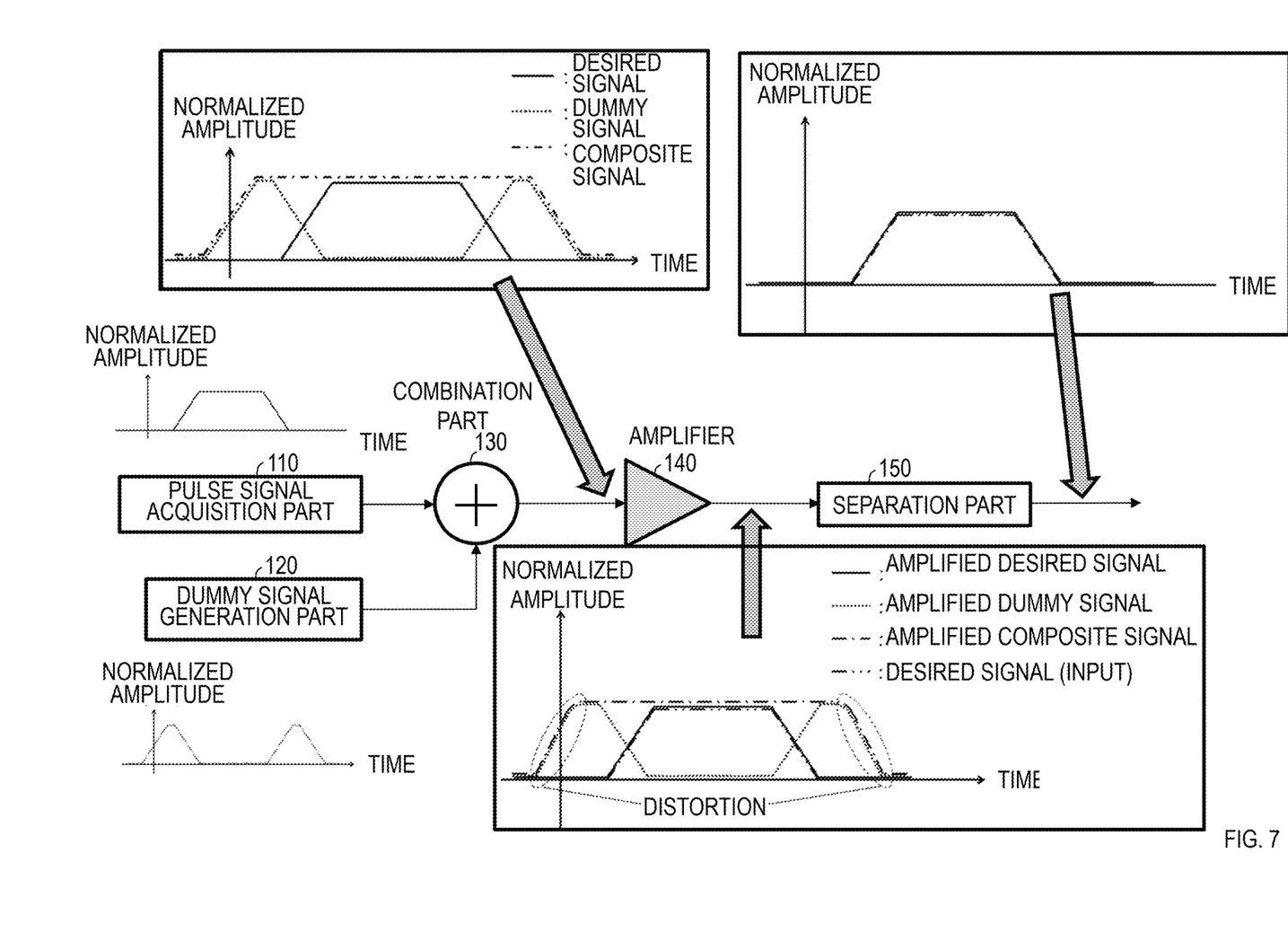
FIG. 7 is a diagram illustrating a concept of operation of the amplification device of the present invention.

FIG. 6 illustrates an example functional configuration of an amplification device of the present invention. An amplification device 100 includes a pulse signal acquisition part 110, a dummy signal generation part 120, a combination part 130, an amplifier 140 and a separation part 150. FIG. 7 illustrates a concept of operation of the amplification device of the present invention. Each of the waveforms in the graphs included in the figure is illustrated with time as the abscissa axis and amplitude normalized by a maximum value thereof as the ordinate axis. In the waveforms in the figure, a solid line indicates a desired signal or an amplified desired signal, a dotted line indicates a dummy signal or an amplified dummy signal and an alternate long and short dash line indicates a composite signal or an amplified composite signal. However, in each of the graph indicating signals after amplification and the graph indicating a signal after separation, an input desired signal is indicated by an alternate long and two short dashes line as reference information.

The pulse signal acquisition part 110 acquires a desired signal that is a pulse signal to be amplified. Here, "acquire" means that the pulse signal acquisition part 110 can acquire a desired signal in any way, and thus includes both the pulse signal acquisition part 110 receiving a desired signal from the outside and the pulse signal acquisition part 110 generating a desired signal.

The dummy signal generation part 120 generates a dummy signal. The dummy signal is a signal that, even if the signal is combined with a desired signal, is separable from the desired signal. The dummy signal can be, for example, a signal having a frequency that is sufficiently far from that of the desired signal. In this case, only the desired signal can be extracted from a signal that is a combination of the desired signal and the dummy signal (separated from the dummy signal) using a low-pass filter or a high-pass filter. Also, different modulation methods may be used for the desired signal and the dummy signal. For example, the desired signal may be modulated by a modulation method for orthogonal frequency division multiplexing (OFDM) and the dummy signal may be modulated by quadrature phase shift keying (QPSK). In this case, also, only the desired signal can be extracted from a signal that is a combination of the desired signal and the dummy signal (separated from the dummy signal) using the modulation method for orthogonal frequency division multiplexing.

The combination part 130 adds the dummy signal before and after the desired signal and outputs the composite signal. Power of the composite signal is power that makes the amplifier 140 operate nonlinearly. Also, in a time range obtained by addition of a predetermined time to a time during which the desired signal exists, the power of the composite signal is constant. In other words, the dummy signal generation part 120 generates the dummy signal at respective timings at which the dummy signal is disposed before and after the desired signal so that the power of the composite signal becomes constant. For example, a timing of acquisition of the desired signal by the pulse signal acquisition part 110 and the power of the desired signal may be determined in advance, and the dummy signal generation part 120 may generate the dummy signal based on the timing and the power. Note that the power of the composite signal needs to be constant enough to meet a demand for distortion reduction necessary for the amplification device 100. The power of the composite signal on the input side of the amplifier 140 (alternate long and short dash line) in FIG. 7 is constant in a range that is wider than the time during which the desired signal exists. For example, in the case of the amplifier whose characteristics are indicated in FIG. 1, the power of the desired signal is around −10 dBm (nonlinear region), and the composite signal is generated in such a manner that the power is −10 dBm in a wide range, by adding the dummy signal.

The amplifier 140 amplifies the composite signal and outputs the amplified composite signal. In the amplified composite signal on the output side of the amplifier 140 (alternate long and short dash line) in FIG. 7, distortion such as illustrated in FIG. 3A occurs in the rise part and distortion such as illustrated in FIG. 3B occurs in the fall part. Each of the parts in which distortion occurs is the part of an amplified dummy signal resulting from amplification of the dummy signal. On the other hand, even if the composite signal is amplified in the nonlinear region, a gain and an amount of heat generated are constant in a part in which the power is constant, and thus, no distortion occurs. Therefore, in a range in which the desired signal exists, no distortion occurs. The "predetermined time" added to the time during which the desired signal exists is sufficient if the "predetermined time" has a length that prevents the desired signal from being affected by nonlinearity and transient response, and thus can appropriately be determined. For example, in the case of the example in FIGS. 3A and 3B, it is sufficient that the "predetermined time" is around $1\mu$, second. In this way, the "predetermined time" only needs to be a time added for stabilization of nonlinear operation of the amplifier 140. Determining the predetermined time as a time added for stabilization of nonlinear operation of the amplifier 140 also provides an effect of reduction of heat generated from the amplifier 140 for amplification of the dummy signal. For the amplifier 140, a semiconductor amplification element may be used, and use of a GaN amplifier makes it easy to output a high-power pulse signal using the nonlinear region. Here, the term "GaN amplifier" means an amplifier including a GaN amplification element. For example, an amplifier having a three-stage connection in which a preamplifier that is a GaAs amplification element such as the one used in the test, and a driver amplifier and a power amplifier, each of which is an GaN amplification element, are connected in series falls within the term "GaN amplifier".

The separation part 150 extracts an amplified desired signal, which is a signal resulting from amplification of the desired signal, from the amplified composite signal and outputs the amplified desired signal. Where the frequency of the dummy signal is higher than the frequency of the desired signal, the separation part 150 needs to be a low-pass filter. If the frequency of the dummy signal is lower than the frequency of the desired signal, the separation part 150 needs to be a high-pass filter. If the desired signal has been modulated, the separation part 150 needs to extract the amplified desired signal according to the method of the modulation.

According to the amplification device of the present invention, a dummy signal is disposed in each of parts in which a shape of a pulse signal is affected by nonlinearity and transient response and the dummy signal is removed after amplification, enabling amplification of the pulse signal with distortion of the pulse signal reduced.

Demonstration Test

Figure 8:
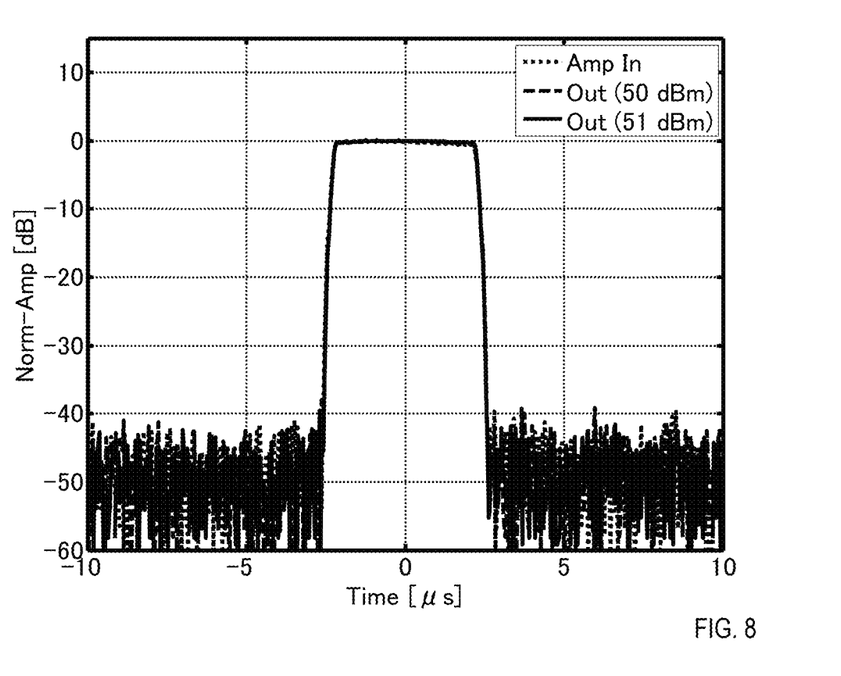
FIG. 8 is a diagram illustrating results of amplification of a pulse signal by the amplification device of the present invention.

FIG. 8 is a diagram illustrating a diagram indicating results of amplification of a pulse signal by the amplification device of the present invention. The abscissa axis represents time and the ordinate axis represents normalized amplitude (amplitude with a maximum value of the signal as 0 dB).

Figure 9A:
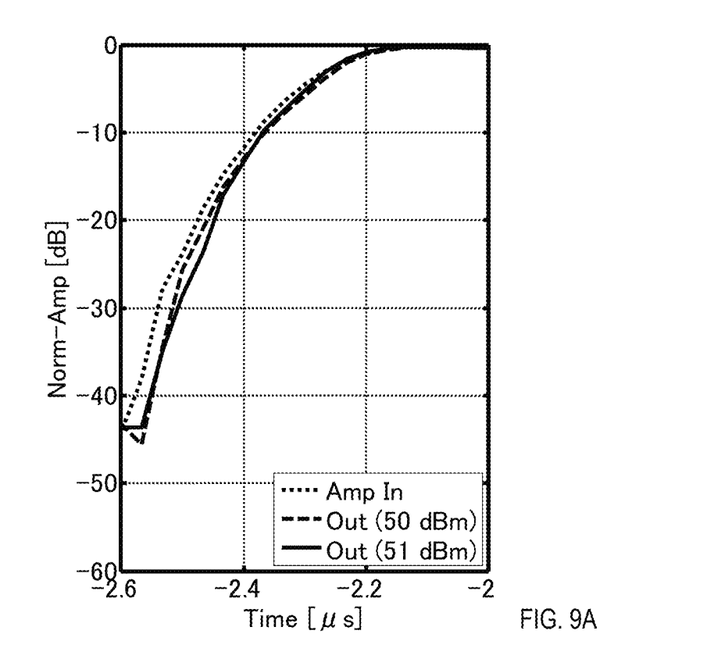
FIG. 9A is a diagram of the rise part in FIG. 8 with the abscissa axis enlarged.
Figure 9B:
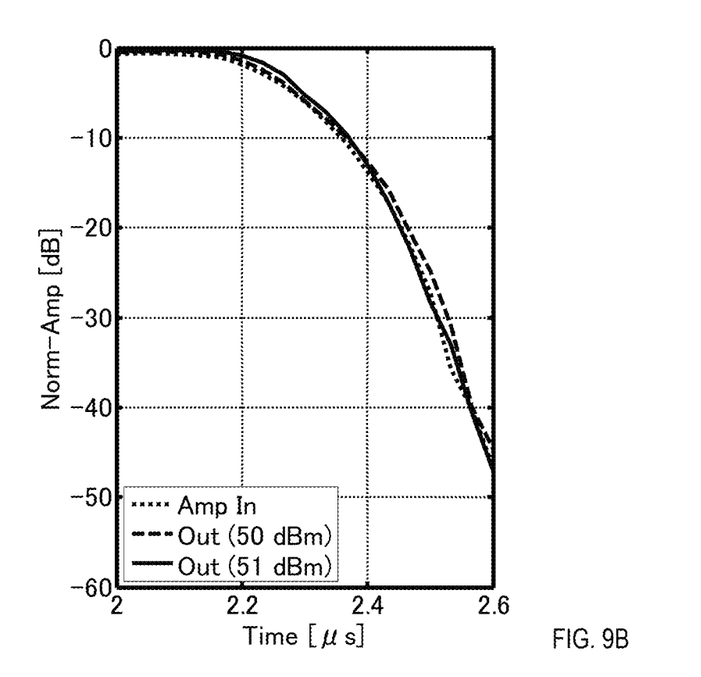
FIG. 9B is a diagram of the fall part in FIG. 8 with the abscissa axis enlarged.

The dotted line (indicated as "Amp In" in the figure) indicates an envelope of an input signal. The dashed line (indicated as "Out (50 dBm)" in the figure) indicates an envelope of an output signal when power of the output signal was 50 dBm. The solid line (indicated as "Out (51 dBm)" in the figure) indicates an envelope of the output signal when power of the output signal was 51 dBm. In the test, the amplifier having the characteristics in FIG. 1 was used as the amplifier 140, and the pulse signal acquisition part 110 acquired a pulse signal that is the same as that in the test for the analysis illustrated in FIG. 2. In this test, a non-modulated pulse signal that is different in center frequency from a desired signal was used for a dummy signal, and the dummy signal was removed by a band-pass filter in the separation part 150. FIG. 9A is a diagram of the rise part in FIG. 8 with the abscissa axis enlarged. FIG. 9B is a diagram of the fall part in FIG. 8 with the abscissa axis enlarged.

Figure 10A:
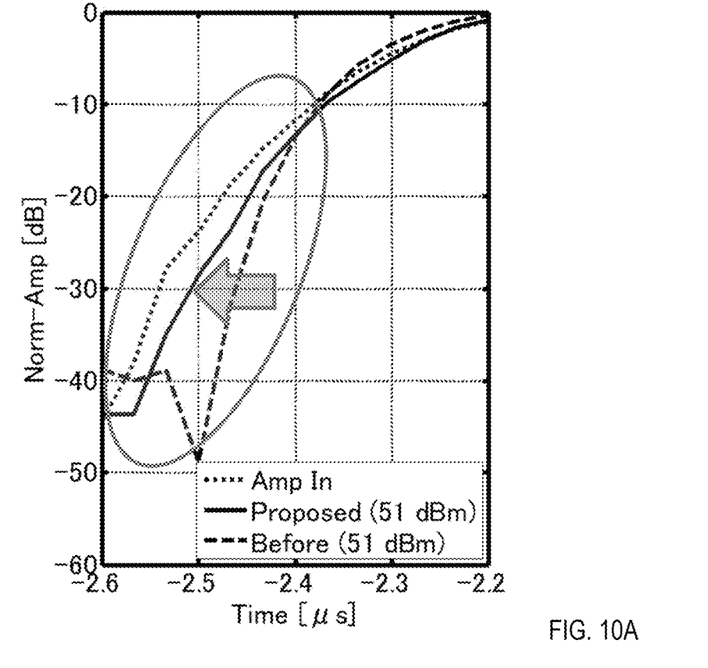
FIG. 10A is a diagram indicating a difference between before employment of the present invention (FIG. 3A) and after employment of the present invention (FIG. 9A)
Figure 10B:
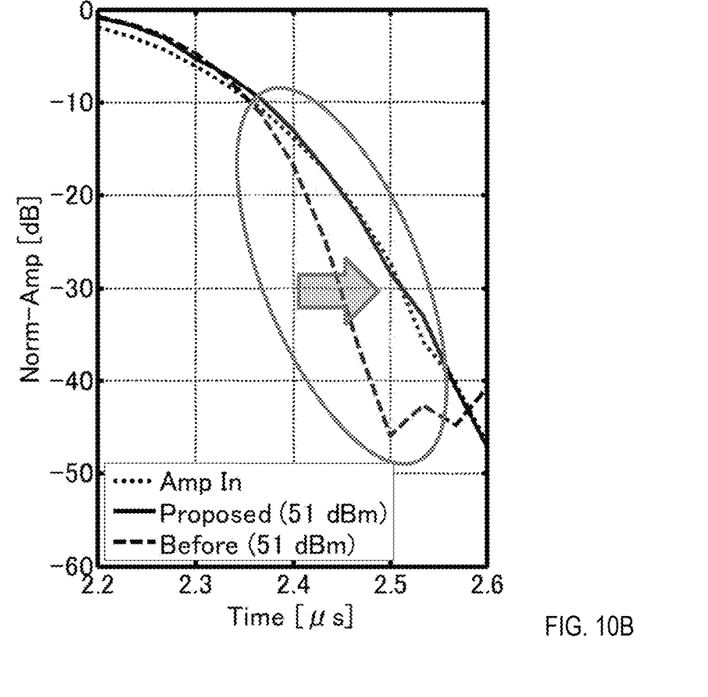
FIG. 10B is a diagram indicating a difference between before employment of the present invention (FIG. 3B) and after employment of the present invention (FIG. 9B)

FIG. 10A indicates a difference between before employment of the present invention (FIG. 3A) and after employment of the present invention (FIG. 9A). FIG. 10B indicates a difference between before employment of the present invention (FIG. 3B) and after employment of the present invention (FIG. 9B). The dotted line (indicated as "Amp In" in each of the figures) indicates an envelope of the input signal. The dashed line (indicated as "Before (51 dBm)" in the figures) indicates an envelope of the output signal when the power of the output signal in FIGS. 3A and 3B was 51 dBm. The solid line (indicated as "Proposed (51 dBm)" in each of the figures) indicates an envelope of the output signal when the power of the output signal in FIGS. 9A and 9B was 51 dBm. It can be understood that employment of the present invention makes amplitude change close to that of the input signal in each of the rise and the fall.

Figure 11:
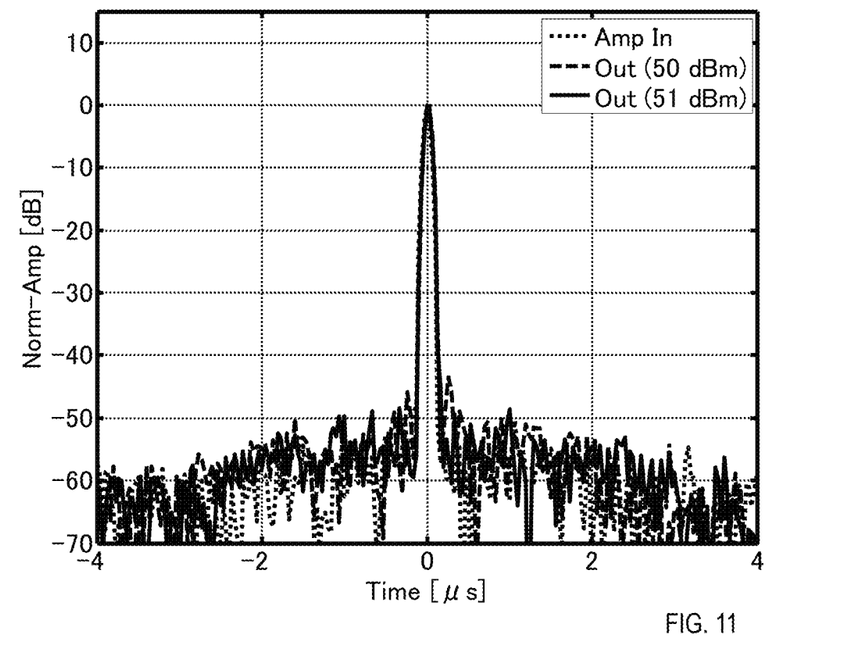
FIG. 11 is a diagram illustrating results of a test in which the signal in FIG. 8 has been subjected to pulse compression.

FIG. 11 illustrates results of a test in which the signal in FIG. 8 has been subjected to pulse compression. In the pulse compression, as in the analysis, a mismatched filter based on Reference Literature 1 was used. In the example in FIG. 11, an SNR was around 50 dB and it can be understood that the SNR was improved by around 5 dB in comparison with the example in FIG. 5.

The present invention enabling amplification with pulse waveform distortion reduced has also been shown in the test. The present invention has no need to make a change or an addition to the configuration of the amplifier itself. Also, there is no need to change the configuration of the present invention even if there is a change in signal settings or ambient temperature. These points are also advantages of the present invention.

First Modification

The first embodiment is premised on the assumption that power of a desired signal is determined in advance. In the present modification, a desired signal is a series of pulse signals with a time interval therebetween. Power of a pulse signal slightly changes according to, e.g., a temperature change. Therefore, an amplification device 100 of the present modification further includes a power detection part 160. The power detection part 160 detects power of a desired signal. A dummy signal generation part 120 can generate a dummy signal based on the power detected by the power detection part 160. For example, the dummy signal generation part 120 can generate a dummy signal based on the power adjusted based on the respective powers of a predetermined number of latest desired signals. As described above, it is possible to respond to fluctuation of power that gently changes like fluctuation of power due to temperature change, based on powers of latest desired signals.

Second Modification

Figure 12:
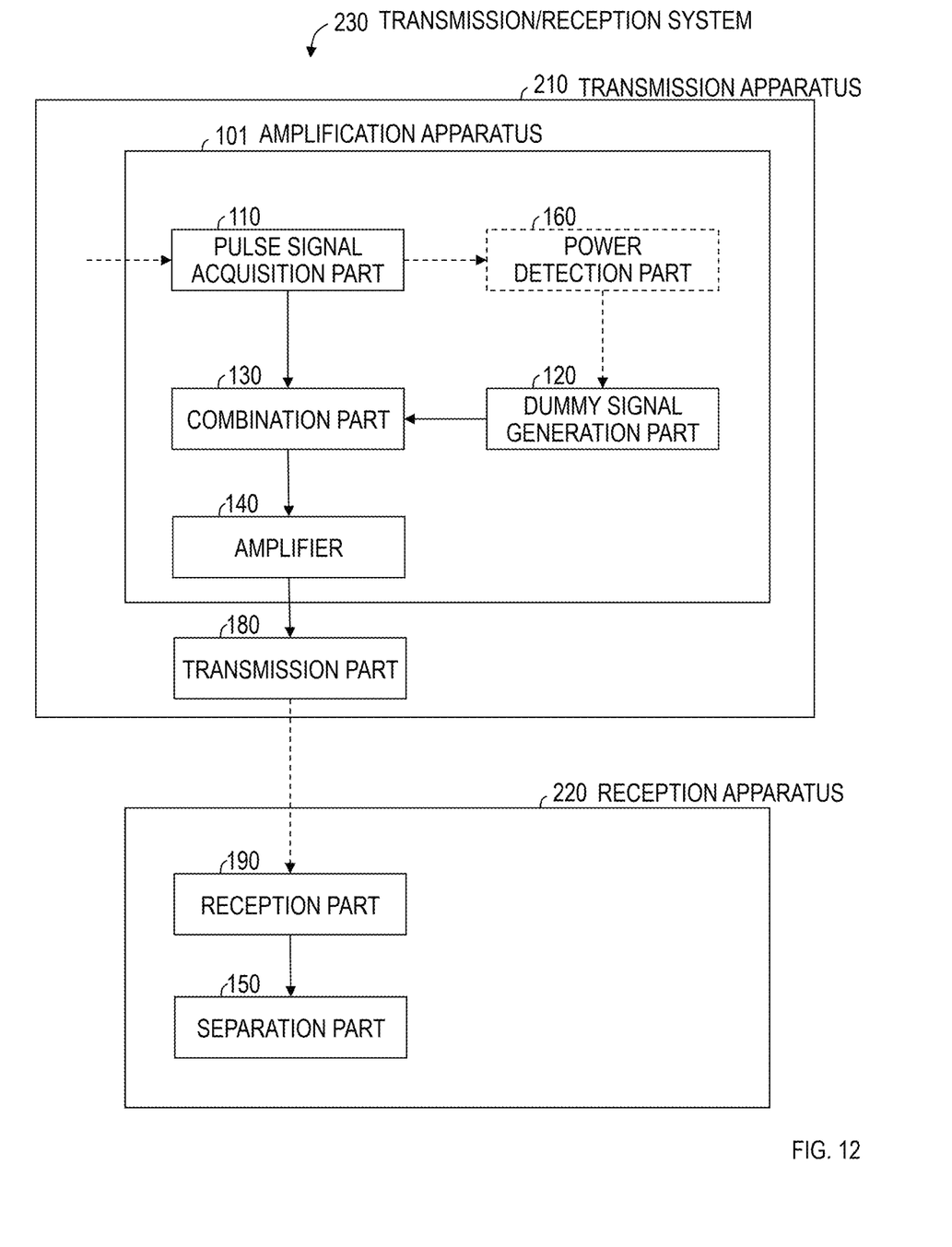
FIG. 12 is a diagram illustrating an example functional configuration of a transmission/reception system of a second modification.

In the first embodiment, the amplification device 100 includes the separation part 150. However, where, like a radar system, a transmission apparatus and a reception apparatus are provided, the reception apparatus may include a separation part. FIG. 12 illustrates an example functional configuration of a transmission/reception system of a second modification. Like a radar system, a transmission/reception system 230 includes a transmission apparatus 210 and a reception apparatus 220. The transmission apparatus 210 includes an amplification device 101 and a transmission part 180. The reception apparatus 220 includes a reception part 190 and a separation part 150. The amplification device 101 includes a pulse signal acquisition part 110, a dummy signal generation part 120, a combination part 130 and an amplifier 140. The pulse signal acquisition part 110, the dummy signal generation part 120, the combination part 130 and the amplifier 140 are the same as those of the first embodiment. The transmission part 180 transmits an amplified composite signal. The reception part 190 receives the amplified composite signal. In the case of a radar system, the reception part 190 receives the amplified composite signal reflected. The separation part 150 extracts an amplified desired signal from the amplified composite signal received. Note that for each of processing before acquisition of the desired signal by the pulse signal acquisition part 110 and processing after extraction of the amplified desired signal by the separation part 150, processing particular to the relevant transmission/reception system may appropriately be performed. Therefore, no configuration that performs the processing is illustrated in FIG. 12. Also, the second modification may be combined with the first modification.

According to the present modification, also, a dummy signal is disposed in each of parts in which a shape of a pulse signal is affected by nonlinearity and transient response and the dummy signal is removed after amplification, enabling amplification with distortion of the pulse signal reduced.

What is claimed is:

1. An amplification device comprising:
a pulse signal acquisition part including
an input port configured to receive a desired pulse signal to be amplified, and;
an output port configured to output the desired pulse signal;
a dummy signal generation part that generates a dummy signal including
an output port configured to output the generated dummy signal, and
a dummy signal generating circuit configured to
generate the dummy signal with a frequency different from the frequency of the received desired pulse signal, or generate the dummy signal with a modulation different from the modulation of the received desired pulse signal, and
generate the dummy signal with a duration such that when the dummy signal is added to the start and end of the received desired pulse signal to produce a composite signal, the power of the composite signal is constant;
a combination part that adds the dummy signal before the start of and after the end of the desired pulse signal and outputs a composite signal including
an input port configured to receive the generated dummy signal from the output port of the dummy signal generation part and to receive the desired pulse signal from the output port of the pulse signal acquisition part, a circuit configured to add the dummy signal before the start of and after the end of the desired pulse signal to produce a composite signal, and an output port configured to output the composite signal;

an amplifier that amplifies the composite signal and outputs an amplified composite signal including an input port configured to receive the composite signal from the output port of the combination part, an amplifier circuit configured to amplify the received composite signal, and an output port configured to output the amplified composite signal; and a separation part that extracts an amplified desired pulse signal that is a signal resulting from amplification of the desired pulse signal, from the amplified composite signal and outputs the amplified desired pulse signal, including an input port configured to receive the amplified composite signal from the output port of the amplifier, the amplified composite signal including an amplified desired pulse signal, an extraction circuit configured to extract the amplified desired pulse signal from the amplified composite signal, the extraction circuit including a frequency-based filter circuit configured to extract the amplified desired pulse signal based on the frequency of the amplified desired pulse signal, or a modulation-based extracting circuit configured to extract the amplified desired pulse signal based on the modulation of the amplified desired pulse signal, and an output port configured to output the extracted amplified desired pulse signal, wherein the power of the composite signal is constant and is a power that causes the amplification part to operate nonlinearly.

2. An amplification device comprising:

a pulse signal acquisition part that acquires a desired signal that is a pulse signal to be amplified, the pulse signal acquisition part including an input port configured to receive the desired pulse signal to be amplified, and an output port configured to output the desired pulse signal;

a dummy signal generation part that generates a dummy signal including an output port configured to output the generated dummy signal, and a dummy signal generating circuit configured to generate the dummy signal with a frequency different from the frequency of the received desired pulse signal, or generate the dummy signal with a modulation different from the modulation of the received desired pulse signal, and generate the dummy signal with a duration such that when the dummy signal is added to the start and end of the received desired pulse signal to produce a composite signal, the power of the composite signal is constant;

a combination part that adds the dummy signal before the start of and after the end of the desired pulse signal and outputs a composite signal including an input port configured to receive the generated dummy signal from the output port of the dummy signal generation part and to receive the desired pulse signal from the output port of the pulse signal acquisition part, a circuit configured to add the dummy signal before the start of and after the end of the desired pulse signal to produce the composite signal, and an output port configured to output the composite signal; and an amplifier that amplifies the composite signal and outputs an amplified composite signal including an input port configured to receive the composite signal from the output port of the combination part, an amplifier circuit configured to amplify the received composite signal, and an output port configured to output the amplified composite signal, wherein the dummy signal is a signal that is separable from the desired pulse signal, the power of the composite signal is a power that causes the amplification part to operate nonlinearly, and the power of the composite signal is constant within a time range obtained by adding a predetermined time to a duration time of the desired pulse signal.

3. A transmission/reception system comprising:

a transmission apparatus that includes the amplification device according to claim 2 and transmits the amplified composite signal; and a reception apparatus that receives the amplified composite signal transmitted by the transmission apparatus, wherein the reception apparatus includes a separation part that extracts an amplified desired pulse signal that is a signal resulting from amplification of the desired pulse signal, from the received amplified composite signal and outputs the amplified desired pulse signal.

4. The amplification device according to claim 1, wherein the power of the composite signal is constant within a time range obtained by adding a predetermined time to a duration time of the desired pulse signal, and the predetermined time is a time added for stabilization of the nonlinear operation of the amplifier.

5. The amplification device according to claim 2, wherein the predetermined time is a time added for stabilization of the nonlinear operation of the amplifier.

6. The amplification device according to claim 1, wherein:

the desired pulse signal is one of consecutive pulse signals with a time interval therebetween;

the amplification device further includes a power detection part that detects the power of the desired pulse signal including an input port configured to receive the desired pulse signal from the output port of the pulse signal acquisition part, an output port configured to output the detected power of the desired pulse signal, and a circuit configured to detect power of desired pulse signal;

the dummy signal generation part further includes an input port configured to receive the detected power of the desired pulse signal from the output port of the power detection part, and a power obtaining circuit configured to obtain the power of the desired pulse signal, and the dummy signal generation part generates the dummy signal based on the power detected by the power detection part.

7. The amplification device according to claim 2, wherein:
the desired pulse signal is one of consecutive pulse signals with a time interval therebetween;
the amplification device further includes a power detection part that detects power of the desired pulse signal including
an input port configured to receive the desired pulse signal from the output port of the pulse signal acquisition part,
an output port configured to output the detected power of the desired pulse signal, and
a circuit configured to detect power of desired pulse signal;
the dummy signal generation part further includes
an input port configured to receive the detected power of the desired pulse signal from the output port of the power detection part, and
a power obtaining circuit configured to obtain the power of the desired pulse signal, and
the dummy signal generation part generates the dummy signal based on the power detected by the power detection part.

8. The amplification device according to claim 4, wherein:
the desired pulse signal is one of consecutive pulse signals with a time interval therebetween;
the amplification device further includes a power detection part that detects power of the desired signal; and
the dummy signal generation part generates the dummy signal based on the power detected by the power detection part.

9. The amplification device according to claim 5, wherein:
the desired pulse signal is one of consecutive pulse signals with a time interval therebetween;
the amplification device further includes a power detection part that detects power of the desired pulse signal; and
the dummy signal generation part generates the dummy signal based on the power detected by the power detection part.

10. The amplification device according to claim 1, wherein the amplifier is a GaN amplifier.

11. The amplification device according to claim 2, wherein the amplifier is a GaN amplifier.

12. The amplification device according to claim 4, wherein the amplifier is a GaN amplifier.

13. The amplification device according to claim 5, wherein the amplifier is a GaN amplifier.

14. The amplification device according to claim 6, wherein the amplifier is a GaN amplifier.

15. The amplification device according to claim 7, wherein the amplifier is a GaN amplifier.

16. The amplification device according to claim 8, wherein the amplifier is a GaN amplifier.

17. The amplification device according to claim 9, wherein the amplifier is a GaN amplifier.

* * * * *